United States Patent
Eskridge

(10) Patent No.: US 8,227,879 B2
(45) Date of Patent: Jul. 24, 2012

(54) SYSTEMS AND METHODS FOR MOUNTING INERTIAL SENSORS

(75) Inventor: Mark Eskridge, Renton, WA (US)

(73) Assignee: Honeywell International Inc., Morristown, NJ (US)

( * ) Notice: Subject to any disclaimer, the term of this patent is extended or adjusted under 35 U.S.C. 154(b) by 140 days.

(21) Appl. No.: 12/846,088

(22) Filed: Jul. 29, 2010

(65) Prior Publication Data

US 2012/0025332 A1   Feb. 2, 2012

(51) Int. Cl.
*G01P 15/08* (2006.01)
*H04R 23/00* (2006.01)

(52) U.S. Cl. ............... 257/417; 257/418; 257/E29.324
(58) Field of Classification Search .............. 257/417, 257/418, E29.324
See application file for complete search history.

(56) References Cited

U.S. PATENT DOCUMENTS

| | | | |
|---|---|---|---|
| 5,723,790 A | 3/1998 | Andersson | |
| 7,202,552 B2 * | 4/2007 | Zhe et al. | 257/659 |
| 7,469,590 B2 * | 12/2008 | Fukuda et al. | 73/718 |
| 7,723,812 B2 * | 5/2010 | Chen et al. | 257/421 |
| 2007/0117244 A1 * | 5/2007 | Chen et al. | 438/50 |
| 2008/0135998 A1 * | 6/2008 | Witvrouw et al. | 257/678 |
| 2008/0185673 A1 | 8/2008 | Theuss | |
| 2008/0217752 A1 | 9/2008 | Hata et al. | |
| 2008/0254572 A1 | 10/2008 | Leedy | |
| 2009/0289318 A1 * | 11/2009 | Lin et al. | 257/433 |
| 2011/0079903 A1 * | 4/2011 | Liu | 257/738 |
| 2011/0244633 A1 * | 10/2011 | Madrid et al. | 438/122 |

FOREIGN PATENT DOCUMENTS

DE   10250321 A1   6/2003

* cited by examiner

*Primary Examiner* — Ngan Ngo
(74) *Attorney, Agent, or Firm* — Lowe Graham Jones PLLC

(57) ABSTRACT

Systems and methods for mounting inertial sensors on a board. On a wafer containing one or more sensor packages having a substrate layer, a sensor layer and an insulator layer located between the sensor layer and the substrate layer, a V-groove is anisotropically etched into one of the substrate layer. The substrate layer is in the 100 crystal plane orientation. The sensor package is then separated from the wafer. Then, a surface of the substrate layer formed by the etching is attached to a board. In one example, three sensor packages are mounted to the board so that their sense axis are perpendicular to each other.

9 Claims, 6 Drawing Sheets

SYSTEMS AND METHODS FOR MOUNTING INERTIAL SENSORS

BACKGROUND OF THE INVENTION

There are six degrees of freedom to measure in an inertial guidance system. Acceleration in the x, y, and z directions, and rotation about the x, y, and z axis must all be measured. Sensors (accelerometers and gyros) are typically only sensitive in or about one axis. This means that the sensors must either be mounted to both vertical and horizontal surfaces within the guidance system (some tipped up 90 degrees) or a mix of sensors, some sensitive to inertia in one plane and some 90 degrees out of plane, must be used. Mounting sensors vertically is expensive, and mixing sensor types also mixes performance strengths and weaknesses in undesirable ways.

Another means of mounting sensors orthogonally to each other is with a "skew" mount. In this method, all sensors are tipped at an angle as though they were sitting on three faces of an imaginary cube, with the corner of the cube they all share pointing "straight up" or "down". However, means for mounting sensors in a "skew" mount fashion are expensive, time consuming and require numerous manufacturing steps.

SUMMARY OF THE INVENTION

This invention makes it possible to mount sensors in a skew mount, using the natural properties of crystalline silicon to form the proper "tipping" angles. It is inexpensive and small. It can also be formed directly into MEMS sensors built on a silicon wafer, eliminating parts and saving cost and space.

Silicon crystals as found in standard wafers for the electronics and MEMS industry etch preferentially along their crystal planes. Silicon crystals have a face centered cubic structure. Wafers of silicon can be ordered with this cubic crystal structure oriented in such a way that "bulk" etching (etching in a tank of solution, such as BOE) naturally creates structures with the proper angles on which to mount sensors for an inertial "cube on corner" solution.

A combination of bulk etching along crystal planes, reactive ion etching (a method which etches without sensitivity to the direction of the crystal), and mechanical processes such as dicing, laser cutting, ultrasonic machining, and particle ablation are used to create angled mounting surfaces directly to MEMS die.

BRIEF DESCRIPTION OF THE DRAWINGS

Preferred and alternative embodiments of the present invention are described in detail below with reference to the following drawings:

FIG. 4-1 illustrates a perspective view of a single-motion sensor package formed in accordance with an embodiment of the present invention;

FIG. 4-2 is a side view of the sensor package of FIG. 4-1 after mounting to a circuit board or comparable device;

FIG. 4-3 is a perspective view of three of the sensor packages of FIG. 4-1 mounted onto a circuit board in an orthogonal configuration;

FIG. 5-1 is an end view of a sensor package formed in accordance with an alternate embodiment of the present invention;

FIG. 5-2 is a side view of the sensor package of FIG. 5-1 mounted onto a circuit board;

FIG. 5-3 is a perspective view of three of the sensor packages of FIG. 5-1 mounted orthogonally on a circuit board.

DETAILED DESCRIPTION OF THE INVENTION

Figure 1:
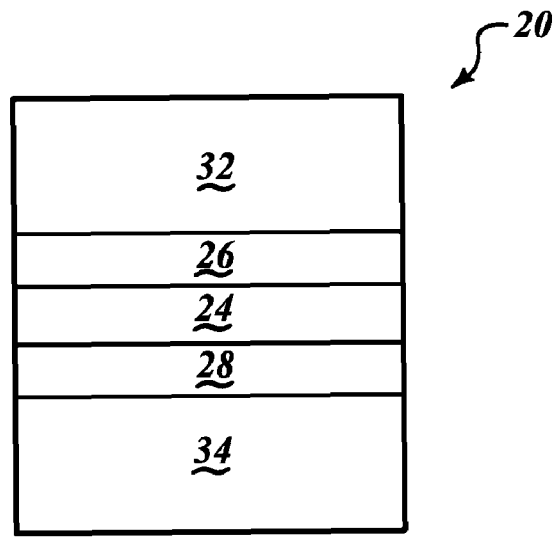
FIG. 1 illustrates a cross-sectional view of a multi-layered wafer used in the construction of the improved package.
Figure 2:
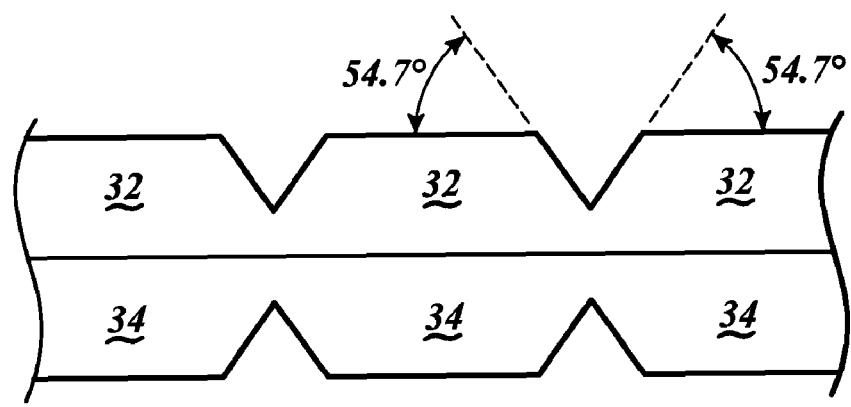
FIG. 2 illustrates a partial cross-sectional view of an etch process performed on the package shown in FIG. 1.
Figure 3:
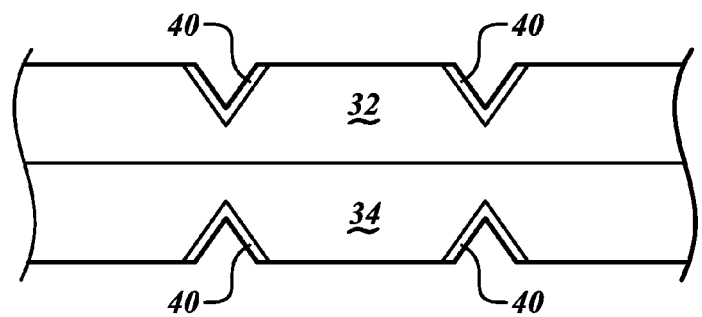
FIG. 3 illustrates a metallization step performed after the etching step of FIG. 2.

FIGS. 1-3 illustrate a sensor package 20 during stages of a process for performing an accurate angular etch of an outer wall of substrates that encase a sensor device. As shown in FIG. 1, the sensor package 20 includes a device layer 24 that includes one or more MEMS accelerometers or gyros for sensing motion in or around a single axis. Attached to either side of the device layer 24 are insulator layers 26, 28. Attached on the outside of the insulator layers 26, 28 are silicon substrate layers 32, 34 that have a 100 crystal plane structure. In one embodiment only one of the silicon substrate layers 32, 34 has a 100 crystal plane structure. All the complement plane structures will also work. The 010 and 001 crystal plane structures also form a 54.7° angled surface with the 111 plane.

FIG. 2 illustrates an anisotropic etch that is performed into the silicon substrate layers 32, 34. This etch produces a 54.7 degree angled surface relative to the surface of the substrates. In this embodiment, the anisotropic etch is not performed all the way to the insulator layers 26, 28 to produce a V-groove 38. A portion of the silicon substrate layers 32, 34 remains. In FIGS. 2 and 3, the insulator layers 26, 28 and the device layer 24 are not shown for clarity. With the silicon substrate layers 32, 34 having a 100 crystal orientation a precise angular etch occurs. The length of time for the etch depends upon how much surface is desired to be shown. The plane in the silicon substrate layers 32, 34 that remains after the etch is the 111 plane of the crystal structure. Various anisotropic etchants may be used, for example, alkali aqueous solutions of KOH, NaOH, LiOH, CsOH, NH4OH, or quaternary ammonium hydroxides, with the possible addition of alcohol. Other alkaline organics may be used.

As shown in FIG. 3, a metallic layer 40 is adhered to at least a portion of the etched V-groove 38 using known processes. Examples of materials applied to the etched surface include: Ti, Pt, Au; Cr, Au; W, Pt, Au. Other metals may be used. The metallic layer 40 is patterned according to what electrical connections are to be made between the sensor in the device layer 24 and external components (e.g. circuit board). An insulator is applied to a portion of the etched V-groove 38 before the metallic layer 40 is applied if vias are used to electrically attach to internal components of the device layer 24 (see FIGS. 5-1 and 5-2). After the metallization of the V-groove is performed, the wafer containing a plurality of MEMS sensors is separated into individual units, such as those shown in FIGS. 4-1 and 5-1. Dicing, laser cutting, ultrasonic machining or particle ablation are used to perform the separation.

Figures 1, 4:
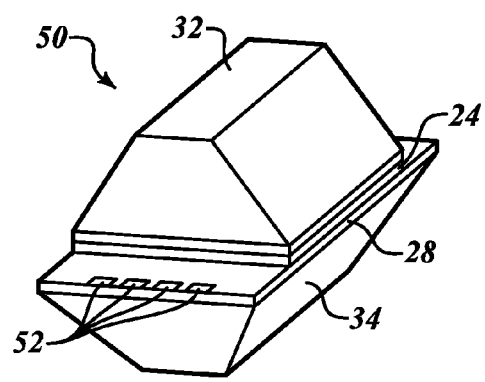
Figures 2, 4:
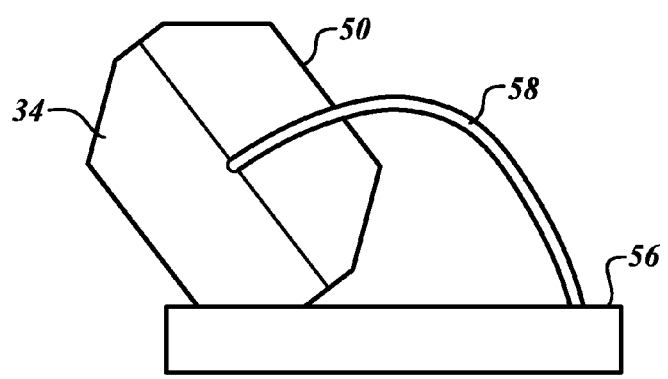
Figures 3, 4:
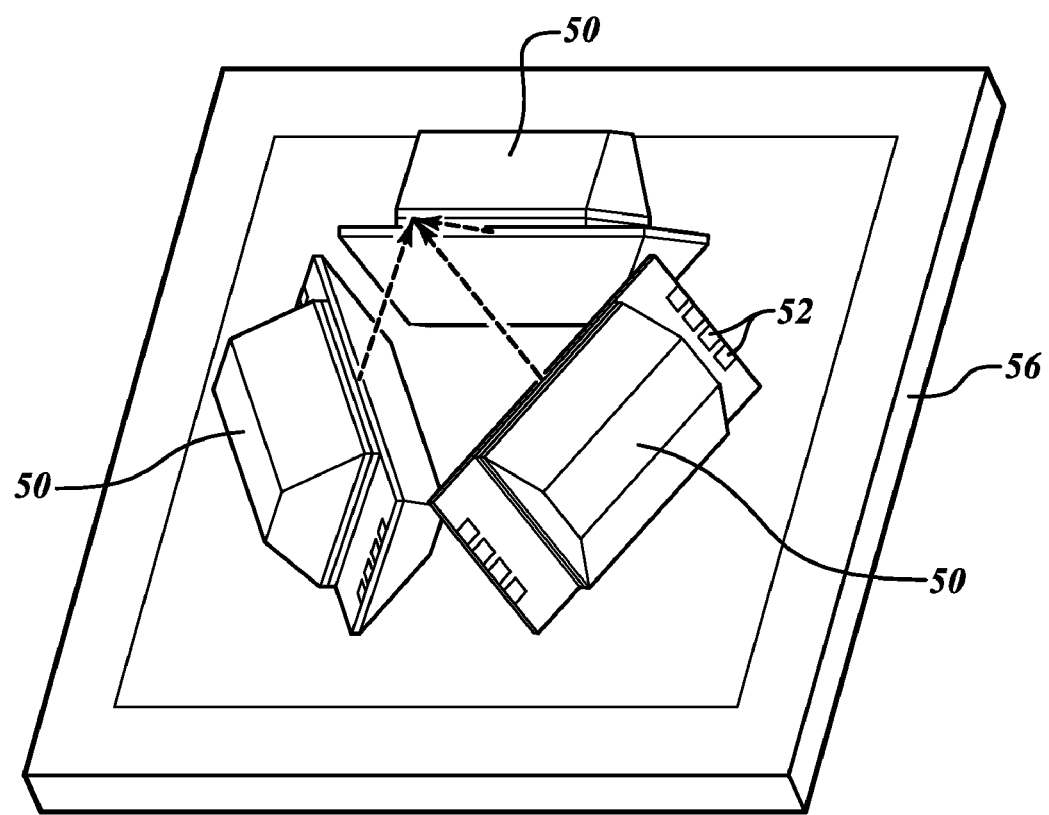

As shown in FIG. 4-1, a single sensor package 50 has been diced using conventional dicing techniques to separate it from adjacent packages after the steps described above. One of the substrate layers 32 is further diced or etched in order to expose a portion of one of the insulator layers 28 that includes one or more electrical leads 52 that attach to the sensor located within the device layer 24.

Next as shown in FIGS. 4-2 and 4-3 the sensor packages 50 are mounted to a circuit board or some other system component 56. The sensor package 50 is mounted on one of the angled sides of the lower substrate 34. Then the exposed electrical leads 52 are attached via wired leads 58 to connectors on the surface of the circuit board or system component 56. The circuit board or system component 56 may be formed at least partially of PTFE, alumina ($AlO_3$), $SiN_3$, $AlN_3$, Si or glass.

The sensor packages 50 are mounted on to the circuit board or system component 56 such that the sense direction for each of the sensors is orthogonal to each other. For example, if each of the sensors located within the sensor packages 50 are in-plane sensors as shown by the vectors emanating from the midpoint of the sensor packages 50 then the vectors form a corner of a cube (i.e. the vectors are orthogonal to one another). Out-of-plane sensors may also be incorporated into the sensor packages 50.

Figures 1, 5:
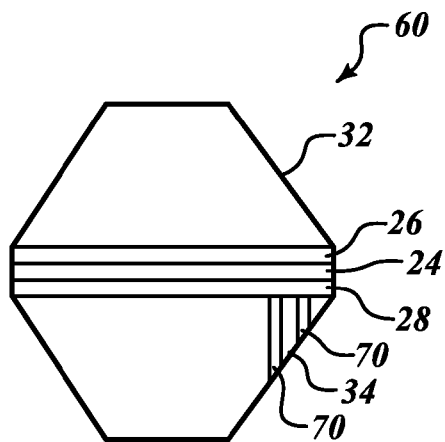
Figures 2, 5:
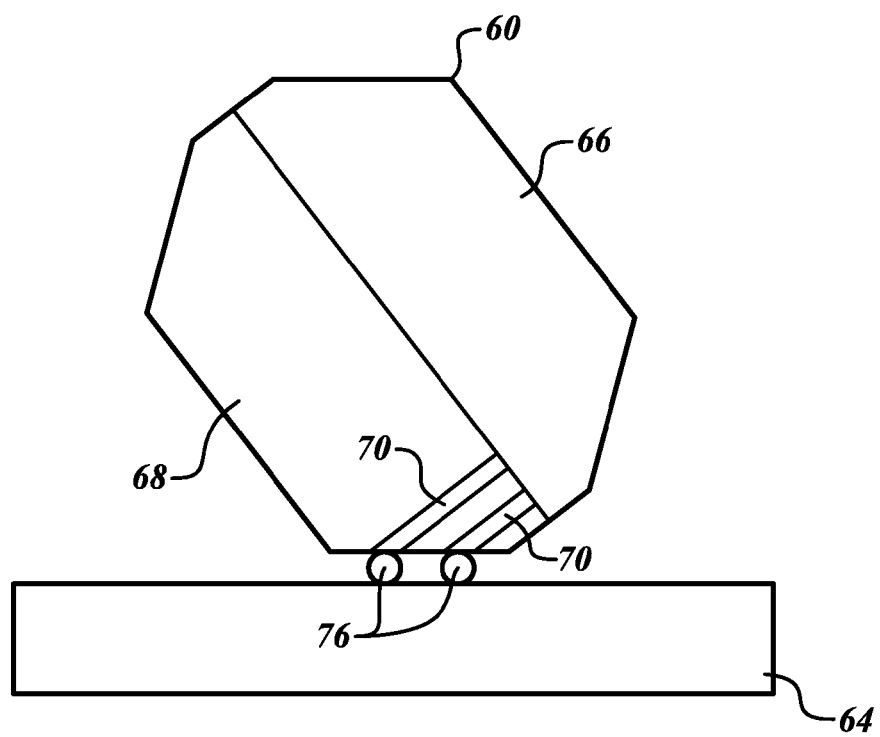
Figures 3, 5:
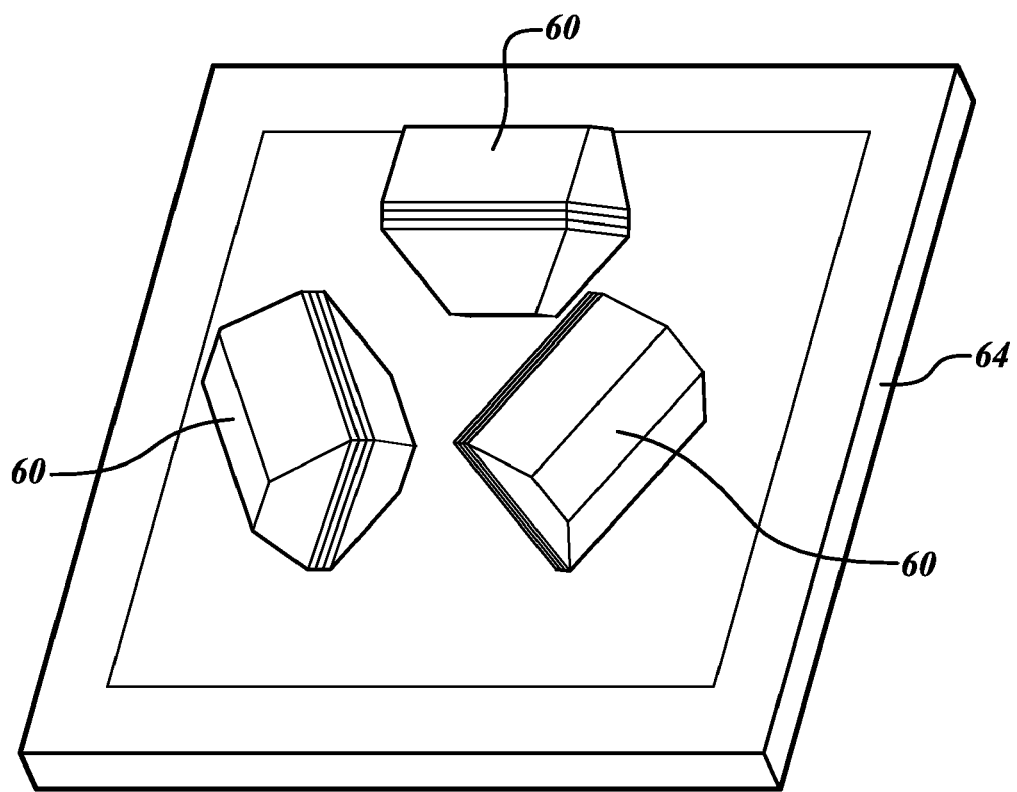

FIG. 5-1 illustrates a sensor package 60 that when separated into individual units, no exposure of leads in the device layer 24 is necessary such as that shown in FIG. 4-1. Before or after the anisotropic etch step an isotropic etch is performed within one of the silicon substrate layers 32, 34 to produce one or more vias that are eventually filled with an insulated conductive material to produce conductive vias 70. The vias 70 pass through both the silicon substrate layers 32 or 34 and the corresponding insulation layer 26 or 28. The metalized material within the vias 70 is attached to leads located on the device layer 24. It can be appreciated that an insulation material is applied to the walls of the vias 70 prior to the metallization. This metallization step may occur simultaneous with the metallization described in FIG. 3.

As shown in FIG. 5-2, the sensor package 60 is mounted to a circuit board (or system component) 64 along the angled edge of the sensor package 60 that includes the metalized vias 70. A conductive bead(s) 76 provides an attachment means between the sensor package 60 and the circuit board 64. The circuit board 64 includes traces that attach to the conductive beads 76. FIG. 5-3 is similar to FIG. 4-3 except that three sensor packages 60 are mounted to circuit board 64.

Figure 6:
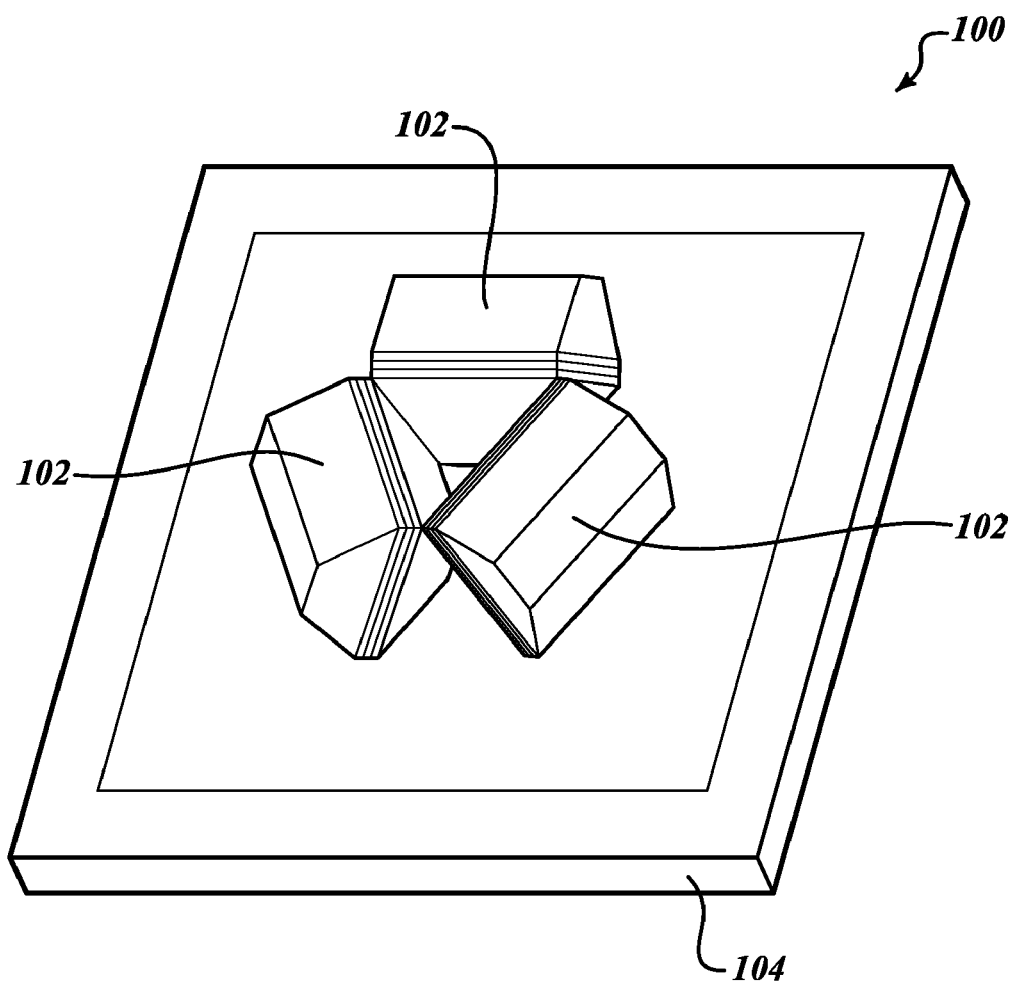
FIG. 6 illustrates a perspective view of three sensor packages tightly mounted onto a circuit board.

FIG. 6 illustrates a system 100 whereby three sensor packages 102 are diced in a manner for them to tightly fit together on a mounting surface 104 thus minimizing the size of the package.

While the preferred embodiment of the invention has been illustrated and described, as noted above, many changes can be made without departing from the spirit and scope of the invention. Accordingly, the scope of the invention is not limited by the disclosure of the preferred embodiment. Instead, the invention should be determined entirely by reference to the claims that follow.

The embodiments of the invention in which an exclusive property or privilege is claimed are defined as follows:

1. A MEMS sensor package system comprising:
   at least one sensor package comprising:
      at least one substrate layer;
      a sensor layer comprising a MEMS sensor; and
      at least one insulator layer; and
   a board,
   wherein the at least one insulator layer is adhered to the sensor layer, the at least one substrate layer is mounted to the at least one insulator layer, the layers comprise a first surface, wherein the first surfaces are approximately parallel to each other, the at least one substrate layer comprising a first side surface having a normal vector that is between 54° and 55.5° different from a normal vector of the first surfaces, wherein the side surface is mounted to the board.

2. The system of claim 1, wherein at least one sensor package comprises at least three sensor packages mounted to the board.

3. The system of claim 2, wherein the three sensor packages comprise accelerometers.

4. The system of claim 3, wherein the accelerometers comprise in-plane accelerometers.

5. The system of claim 3, wherein the accelerometers comprise out-of-plane accelerometers.

6. The system of claim 2, wherein the three sensor packages comprise rotational sensors.

7. The system of claim 1, wherein the sensor package comprises one or more conductive vias that electrically connect to an electrical trace on the sensor layer, the one or more conductive vias passes through the substrate layer with the first side surface and one of the at least one insulator layers.

8. The system of claim 7, further comprising at least one conductive bead bonded to the board and the sensor package, the at least one conductive bead being electrically coupled to one or more of the conductive vias and an electrical trace on the board.

9. The system of claim 1, wherein the board is a circuit board.

* * * * *